United States Patent
Mayer

(10) Patent No.: US 6,501,018 B2
(45) Date of Patent: Dec. 31, 2002

(54) EMI GASKET HAVING ENHANCED Z-AXIS COMPLIANCE

(75) Inventor: David W. Mayer, Fort Collins, CO (US)

(73) Assignee: Hewlett-Packard Company, Palo Alto, CA (US)

(*) Notice: Subject to any disclaimer, the term of this patent is extended or adjusted under 35 U.S.C. 154(b) by 0 days.

(21) Appl. No.: 09/774,867

(22) Filed: Jan. 31, 2001

(65) Prior Publication Data

US 2002/0100598 A1 Aug. 1, 2002

(51) Int. Cl.[7] .................................................. H05K 9/00
(52) U.S. Cl. .............................. 174/35 R; 174/35 GC; 361/816; 361/818; 361/718; 361/719
(58) Field of Search ................ 174/35 GC, 35 R; 361/688, 709, 717, 718, 719, 799, 800, 816, 818; 257/712, 713, 718

(56) References Cited

U.S. PATENT DOCUMENTS

| | | | | |
|---|---|---|---|---|
| 5,959,244 A | * | 9/1999 | Mayer ................... | 174/35 GC |
| 6,061,235 A | * | 5/2000 | Cromwell et al. ......... | 165/80.3 |
| 6,188,577 B1 | * | 2/2001 | Liu ........................... | 165/80.3 |
| 6,219,239 B1 | * | 4/2001 | Mellberg et al. ........... | 165/80.3 |
| 6,362,977 B1 | * | 3/2002 | Tucker et al. ............. | 174/35 R |

* cited by examiner

Primary Examiner—Dean A. Reichard
Assistant Examiner—Carmelo Oliva
(74) Attorney, Agent, or Firm—Kevin M. Hart

(57) ABSTRACT

An EMI gasket exhibits enhanced compliance in the direction orthogonal to the plane of the circuit board on which a chip or chip-and-socket assembly is mounted. Therefore, the gasket may be used with chips or chip-and-socket assemblies having a variety of heights. In an embodiment, a frame made from a sheet of metal has a planar portion with an opening formed therein. The opening is adapted to fit around a perimeter of an integrated circuit chip. The sheet of metal includes top and bottom planar surfaces. Top and bottom resilient conductive members are attached to the top and bottom planar surfaces, respectively.

20 Claims, 4 Drawing Sheets

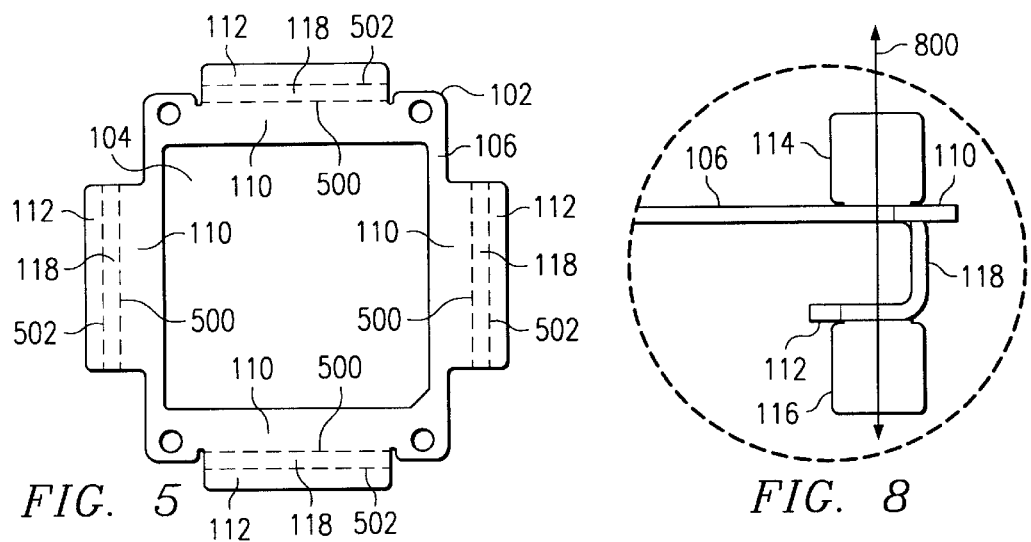
FIG. 5
FIG. 8
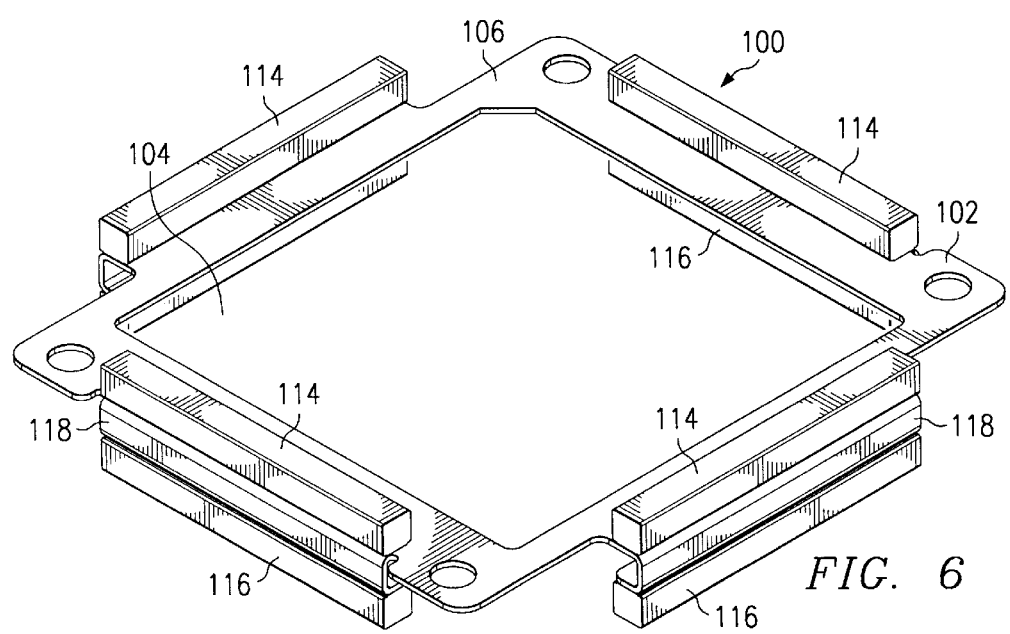
FIG. 6
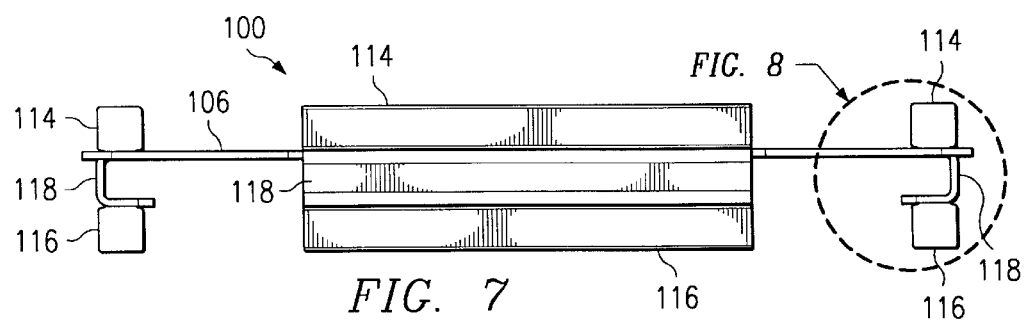
FIG. 7

EMI GASKET HAVING ENHANCED Z-AXIS COMPLIANCE

FIELD OF THE INVENTION

This invention relates to electromagnetic interference ("EMI") containment in electronic systems. More particularly, the invention relates to the containment of EMI that is generated in and around an integrated circuit chip.

BACKGROUND

Digital electronic systems such as computers tend to radiate electromagnetic energy. Generally this radiated electromagnetic energy is unwanted because it may interfere with the operation of other electronic systems located near the radiating system. This phenomenon is known both as electromagnetic interference ("EMI") and radio frequency interference ("RFI"). As used herein, the term EMI will refer both to EMI and to RFI. Regulations exist in the United States and other countries that specify legal maxima for EMI caused by electronic products. It is therefore important to design electronic products so that the electromagnetic energy generated within them is minimized or effectively contained.

High-speed digital integrated circuit chips such as microprocessors are particularly prominent generators of EMI. Integrated circuit chips of this type also generate a relatively large amount of heat energy, which energy must be removed from the chip or redistributed so that the chip will not overheat and fail.

A need therefore exists for a technique that will help to contain the EMI generated by an integrated circuit chip without impeding the removal of heat from the integrated circuit chip.

By way of further background, it is common to couple integrated circuit chips to printed circuit boards by means of a socket. A variety of socket types may be used with the same integrated circuit chip. Each of the various socket types may have different dimensions. In particular, each of the various socket types may have a different height. Thus, the distance between the top of a given integrated circuit chip and the surface of the printed circuit board will vary depending on which socket type is chosen for use.

SUMMARY OF THE INVENTION

An EMI gasket according to the invention exhibits enhanced compliance in the direction orthogonal to the plane of the circuit board on which a chip or chip-and-socket assembly is mounted. (As used herein, the term "z axis" will be synonymous with the direction just defined in the preceding sentence.) Because of the gasket's enhanced compliance in the z axis, the gasket may be used with chips or chip-and-socket assemblies having a variety of heights. Embodiments of the invention can be defined from numerous points of view. For example:

In one aspect, a frame made from a sheet of metal has a planar portion with an opening formed therein. The opening is adapted to fit around a perimeter of an integrated circuit chip. The sheet of metal includes top and bottom planar surfaces. Top and bottom resilient conductive members are attached to the top and bottom planar surfaces, respectively.

In another aspect, a sheet metal frame defines an opening adapted to fit around a perimeter of an integrated circuit chip. The opening can be thought of as having an axis that passes orthogonally through it. The sheet metal of the frame includes top and bottom planar surfaces. Top and bottom resilient conductive members are attached to the top and bottom planar surfaces, respectively. The resilient conductive members are disposed such that a line can be drawn parallel to the axis of the opening and passing through both the top and the bottom resilient conductive members.

In another aspect, a sheet metal frame defines an opening adapted to fit around a perimeter of an integrated circuit chip. The sheet metal frame is folded to form top and bottom planar surfaces. Top and bottom resilient conductive members are attached to the top and bottom planar surfaces, respectively.

In another aspect, a sheet metal frame defines an opening adapted to fit around a perimeter of an integrated circuit chip. The sheet metal of the frame includes top and bottom planar surfaces. The top and bottom planar surfaces are not coplanar with one another, but they are coupled together by a conductive wall. Top and bottom resilient conductive members are attached to the top and bottom planar surfaces, respectively.

In a still further aspect, a sheet metal frame defines an opening adapted to fit around a perimeter of an integrated circuit chip. The sheet metal of the frame is folded to form top and bottom planar surfaces. Top and bottom resilient conductive members are attached to the top and bottom planar surfaces, respectively. Both the top and the bottom resilient conductive members are made with a resilient filler material covered with a conductive fabric.

BRIEF DESCRIPTION OF THE DRAWINGS

FIG. 5 is an unfolded view of the frame portion of the gasket of FIG. 1.

FIG. 6 is an oblique assembled view of the gasket of FIG. 1.

FIG. 7 is a side view of the gasket of FIG. 6.

FIG. 8 is a close-up view of the area indicated in FIG. 7.

DETAILED DESCRIPTION OF THE PREFERRED EMBODIMENTS

Figure 1:
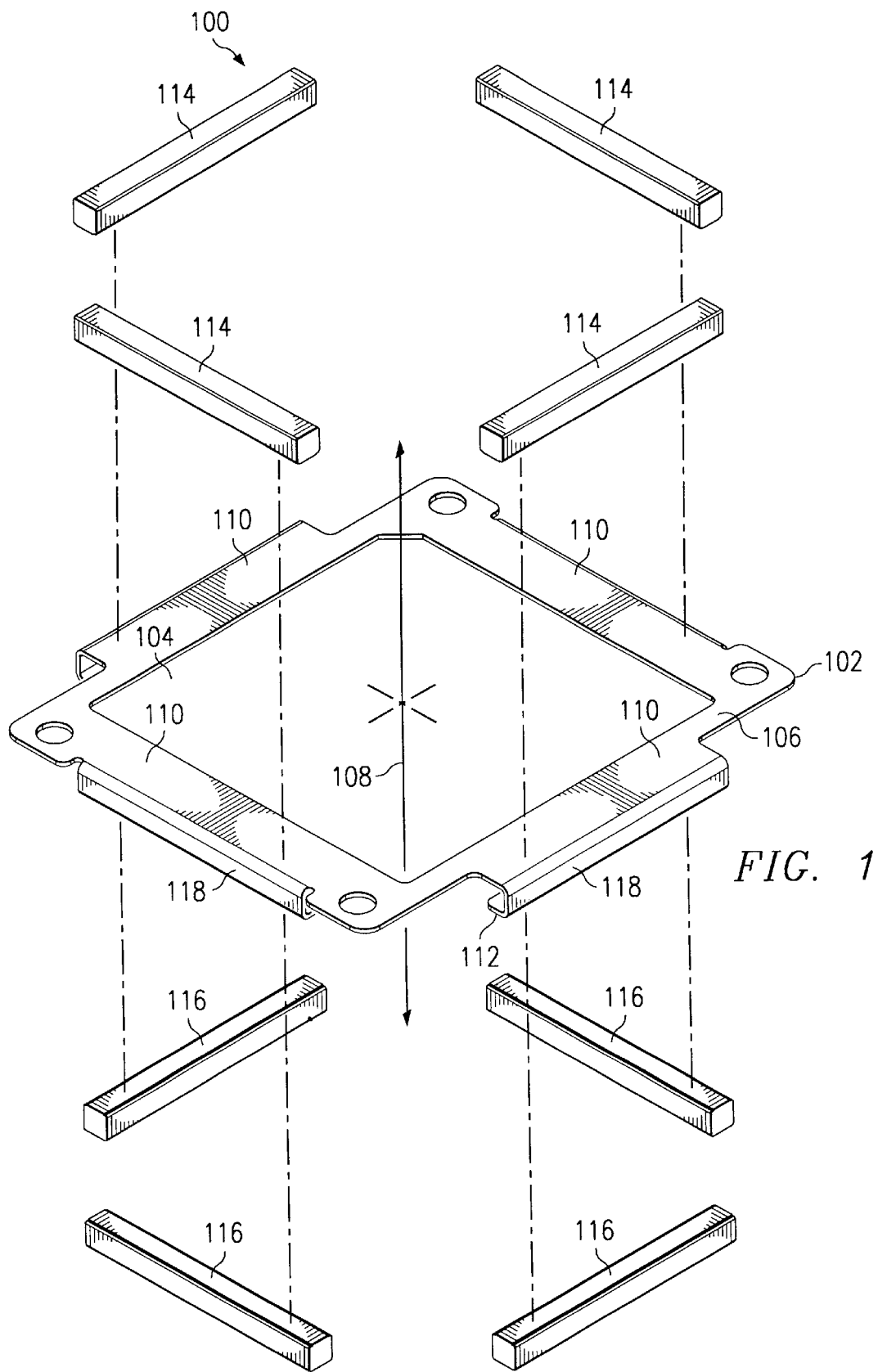
FIG. 1 is an oblique exploded view of an EMI gasket according to a preferred embodiment of the invention.
Figure 2:
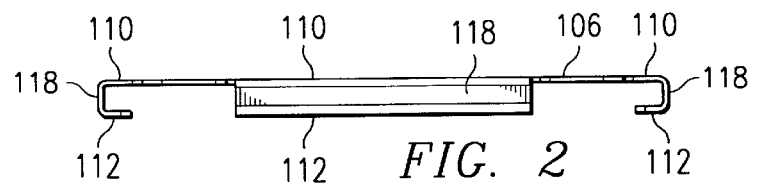
FIG. 2 is a side view of the frame portion of the gasket of FIG. 1.
Figure 3:
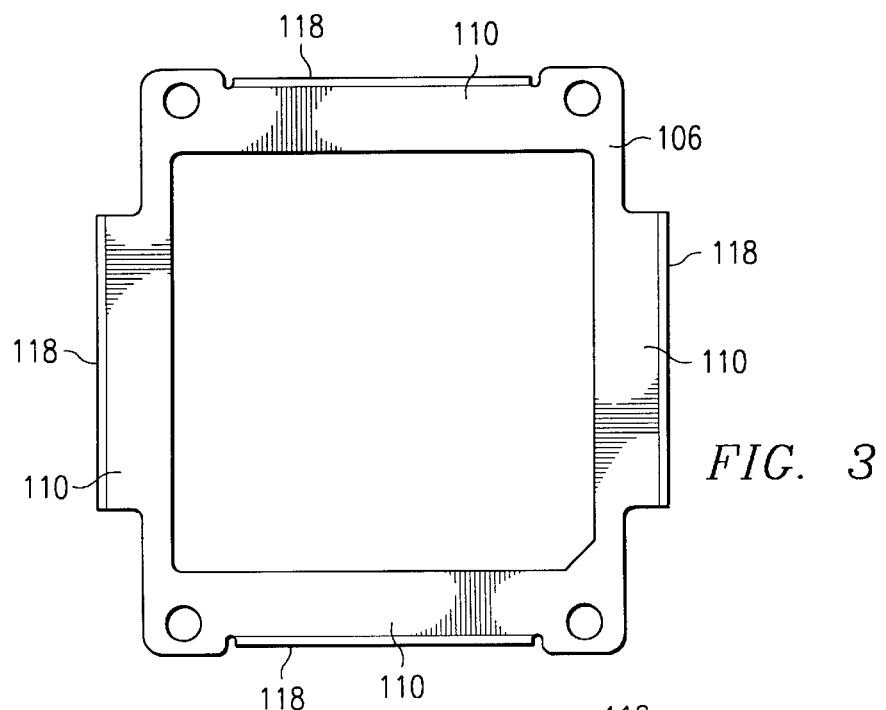
FIG. 3 is a top view of the frame portion of the gasket of FIG. 1.
Figure 4:
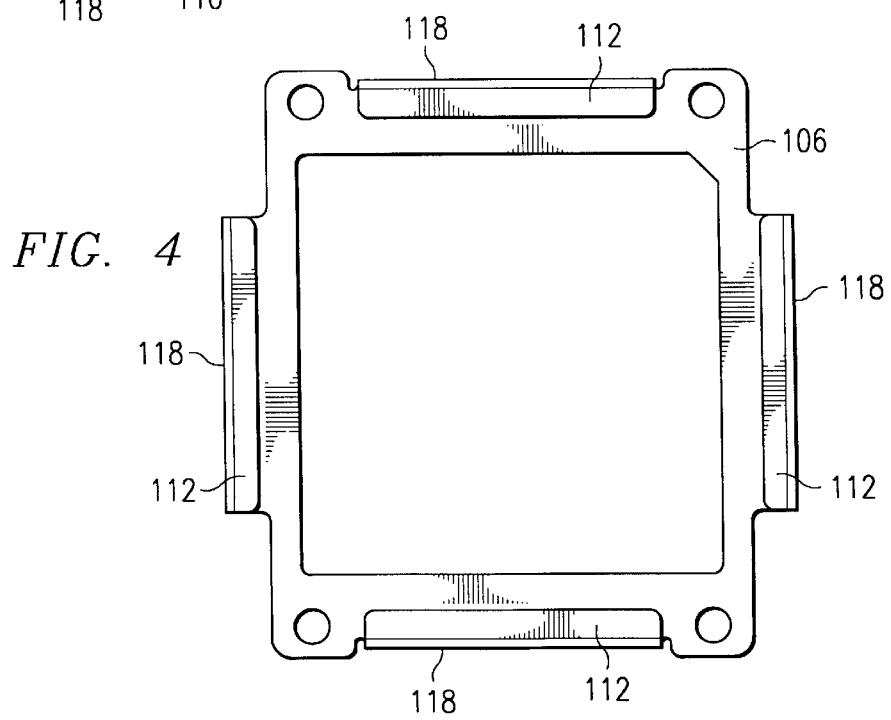
FIG. 4 is a bottom view of the frame portion of the gasket of FIG. 1.

FIG. 1 illustrates, in exploded view, an EMI gasket 100 according to a preferred embodiment of the invention. A frame 102 is fashioned from a sheet of metal. In the embodiment shown, an opening 104 is formed in a planar portion 106 of the sheet of metal. In alternative embodiments, frame 102 may define opening 104 by other means, such as with vertical walls rather than with a planar portion 106, and may be cast rather than cut or folded. Opening 104 is adapted to fit around a perimeter 902 of an integrated circuit chip such as integrated circuit chip 904. (See FIG. 9.) Opening 104 can be though of as having an axis 108 passing orthogonally through it. In operation of gasket 100, axis 108 will preferably be oriented substantially in the z-axis as defined hereinabove.

In the embodiment shown, chip 904 has a generally rectangular perimeter, and opening 104 also has a generally rectangular shape. Thus, frame 102 includes four top planar surfaces 110 and four bottom planar surfaces 112. Opening 104 could be designed with a different shape or number of sides depending on the shape of chip 904. In the embodiment shown, top planar surfaces 110 are coplanar with planar portion 106 of frame 102. In alternative embodiments, frame 102 could be turned upside down so that surfaces 110 would constitute bottom surfaces and surfaces 112 would constitute top surfaces.

Top resilient conductive members 114 and bottom resilient conductive members 116 are attached to top and bottom planar surfaces 110, 112, respectively. In an embodiment, resilient conductive members 114, 116 were attached to their associated planar surfaces 110, 112 by using an adhesive. Alternative attachment techniques may be used. Preferably, attachment should result in a conductive path is formed between top resilient conductive members 114 and bottom resilient conductive members 116. In the embodiment shown, such a path exists by virtue of the following facts: Top and bottom planar surfaces 110, 112 are themselves conductive; and the top and bottom surfaces 110, 112 of each corresponding pair are coupled together by a conductive wall 118. Conductive walls 118 may be formed out of the same piece of sheet metal that forms frame 102 and top and bottom planar surfaces 110, 112. Top and bottom planar surfaces 110, 112 and conductive walls 118 were formed in the illustrated embodiment by making two parallel folds in the sheet metal of frame 102. The two parallel folds 500, 502 thus defined conductive walls 118. (See FIG. 5.)

For a rectangular opening embodiment such as the one illustrated, top and bottom resilient conductive members 114, 116 are preferably disposed in pairs along each of the four sides of opening 104. In an embodiment, resilient conductive members 114, 116 were cut from longer pieces of gasket material having a resilient filler and covered with a conductive fabric. Material of this type may be purchased, for example, from Schlegel, Inc. under the product number E7469T08400. In other embodiments, alternative materials may be used so long as the material provides compliance in the z-axis when attached to planar surfaces 110, 112.

It is believed that enhanced stability is achieved by mounting resilient conductive members 114, 116 (and designing the corresponding locations of planar surfaces 110, 112) in an over-and-under arrangement as shown. By way of definition, when members 114, 116 are mounted in an over-and-under arrangement, a line 800 could be drawn parallel to axis 108 and passing through both the top and bottom resilient conductive members 114, 116 of a given pair. In alternative embodiments, members 114, 116 could be arranged differently so that they are not one on top of the other in the z-axis. Similar EMI results will obtain so long as the resilient conductive members 114, 116 extend across a sufficient percentage of the length of each sides of opening 104.

Figure 9:
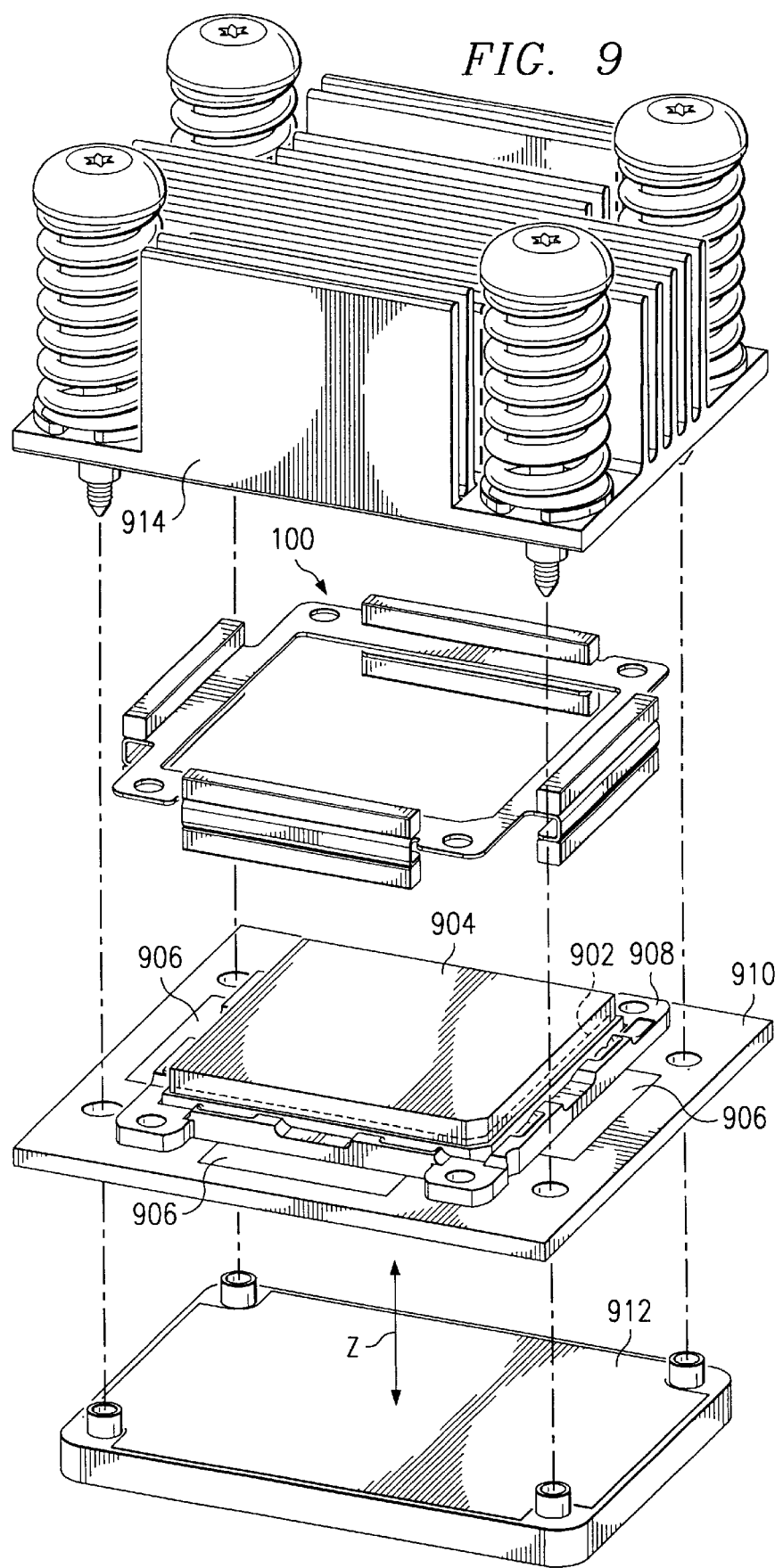
FIG. 9 is an oblique exploded view illustrating a way in which the gasket of FIG. 6 may be assembled with other components to help contain EMI generated by an integrated circuit chip.

FIG. 9 illustrates, by way of example, how gasket 100 might be employed to help contain EMI generated by an integrated circuit 904. Ground traces 906 may be formed on printed circuit board 910 around the four sides of chip 904 and socket 908. Ground traces 906 should be located so that they make contact with bottom member 116 of gasket 102 when the assembly is completed. A conductive bolster plate may be disposed on the side of printed circuit board 910 opposite chip 904. Gasket 100 may be placed down over chip 904 or chip-and-socket assembly 904/908 so that opening 104 fits around the perimeter 902 of chip 904. Then, a heat exchanging device 914 with an electrically conductive bottom surface may be placed down over the gasket 100 and chip 904. As long as the uncompressed height of gasket 100 measured in the z axis is greater than or equal to the height of chip 904 and socket 908 measured from the top surface of circuit board 910, resilient members 114, 116 will compress as heat exchanging device 914 is lowered and secured. The result will be an effective EMI seal around chip 904 where members 114, 116 are present. Heat exchange device 914 and bolster plate 912 help to contain EMI directed out from the top and bottom of chip 904.

What is claimed is:

1. An EMI gasket, comprising:

a frame comprising a sheet of metal having an opening formed in a first planar portion thereof;

wherein the opening is adapted to fit around a perimeter of an integrated circuit chip;

wherein the sheet of metal comprises top and bottom planar surfaces;

wherein neither of the top and bottom planar surfaces is an edge of the sheet; and further comprising top and bottom resilient conductive members attached to the top and bottom planar surfaces, respectively, so that a conductive path is formed between the top and bottom resilient conductive members.

2. The EMI gasket of claim 1, wherein the opening has a generally rectangular shape; and wherein the top and bottom resilient conductive members are disposed in pairs along each of the four sides of the opening.

3. The EMI gasket of claim 1, wherein at least one of the top and bottom resilient conductive members comprises a resilient filler material covered with a conductive fabric.

4. The EMI gasket of claim 1, wherein at least one of the resilient conductive members is attached to its associated planar surface with adhesive.

5. The EMI gasket of claim 1, wherein one of the top and bottom planar surfaces is coplanar with the first planar portion of the sheet of metal.

6. The EMI gasket of claim 5, wherein the top and bottom planar surfaces are not coplanar with one another.

7. The EMI gasket of claim 6, wherein the top and bottom planar surfaces are coupled to one another by a conductive wall.

8. The EMI gasket of claim 7, wherein the conductive wall comprises a portion of the sheet of metal.

9. The EMI gasket of claim 1, wherein both the top and the bottom resilient conductive members comprise a resilient filler material covered with a conductive fabric.

10. An EMI gasket, comprising:

a metal frame defining an opening adapted to fit around a perimeter of an integrated circuit chip;

wherein the metal of the frame is folded to form a top planar surface and a bottom planar surface;

wherein the top and bottom planar surfaces are not coplanar with one another but are coupled to one another by a conductive wall defined by two parallel folds in the metal of the frame; and top and bottom resilient conductive members attached to the top and bottom planar surfaces, respectively, so that a conductive path is formed between the top and bottom resilient conductive members.

11. The EMI gasket of claim 10, wherein the opening has a generally rectangular shape; and wherein the top and bottom resilient conductive members are disposed in pairs along each of the four sides of the opening.

12. The EMI gasket of claim 10, wherein at least one of the top and bottom resilient conductive members comprises a resilient filler material covered with a conductive fabric.

13. The EMI gasket of claim 10, wherein at least one of the resilient conductive members is attached to its associated planar surface with adhesive.

14. The EMI gasket of claim 10, wherein both the top and the bottom resilient conductive members comprise a resilient filler material covered with a conductive fabric.

15. An EMI gasket, comprising:

a metal frame defining an opening adapted to fit around a perimeter of an integrated circuit chip;

wherein the metal of the frame comprises a top planar surface and a bottom planar surface defined by folds in the metal such that the width of each of the top and bottom planar surfaces is substantially greater than the thickness of the metal;

wherein the top and bottom planar surfaces are not coplanar with one another but are coupled together by a conductive wall; and top and bottom resilient conductive members attached to the top and bottom planar surfaces, respectively, so that a conductive path is formed between the top and bottom resilient conductive members.

16. The EMI gasket of claim 15, wherein the opening has a generally rectangular shape; and wherein the top and bottom resilient conductive members are disposed in pairs along each of the four sides of the opening.

17. The EMI gasket of claim 15, wherein at least one of the top and bottom resilient conductive members comprises a resilient filler material covered with a conductive fabric.

18. The EMI gasket of claim 15, wherein at least one of the resilient conductive members is attached to its associated planar surface with adhesive.

19. The EMI gasket of claim 15, wherein the conductive wall comprises a portion of the metal of the frame.

20. The EMI gasket of claim 15, wherein both the top and the bottom resilient conductive members comprise a resilient filler material covered with a conductive fabric.

* * * * *